United States Patent [19]

Okamoto

[11] Patent Number: 5,646,891
[45] Date of Patent: Jul. 8, 1997

[54] ELECTRICALLY ERASABLE AND PROGRAMMABLE READ ONLY MEMORY DEVICE WITH ERASE VERIFY CIRCUIT FOR EXACTLY VERIFYING ERASED STATE OF MEMORY CELLS

[75] Inventor: Toshiharu Okamoto, Tokyo, Japan

[73] Assignee: NEC Corporation, Tokyo, Japan

[21] Appl. No.: 604,619

[22] Filed: Feb. 21, 1996

[30] Foreign Application Priority Data

Feb. 21, 1995 [JP] Japan ................... 7-032227

[51] Int. Cl.$^6$ ........................... G11C 16/00
[52] U.S. Cl. ................ 365/185.22; 365/185.23; 365/201
[58] Field of Search ............... 365/185.22, 201, 365/200, 218, 185.23, 185.33, 230.06

[56] References Cited

U.S. PATENT DOCUMENTS

| | | | |
|---|---|---|---|
| 4,460,982 | 7/1984 | Gee et al. | 365/185.22 |
| 5,297,096 | 3/1994 | Terada et al. | 365/185.22 |
| 5,335,198 | 8/1994 | Van Buskirk et al. | 365/185.22 |
| 5,400,287 | 3/1995 | Fuchigami | 365/185.22 |
| 5,528,546 | 6/1996 | Chao et al. | 365/185.22 |

FOREIGN PATENT DOCUMENTS

| | | |
|---|---|---|
| 3-259499 | 11/1991 | Japan . |
| 4-3395 | 1/1992 | Japan . |
| 4-26996 | 1/1992 | Japan . |

*Primary Examiner*—Tan T. Nguyen
*Attorney, Agent, or Firm*—Sughrue, Mion, Zinn, Macpeak & Seas

[57] ABSTRACT

A verify unit incorporated in an electrically erasable and programmable read only memory device concurrently verifies erased state for selected floating gate type memory transistors in an erase-and-verify mode, and generates a detecting signal representative of an entry of the selected floating gate type memory transistors into the erased state so as to cause a sense amplifier unit to supply a verify signal to an external eraser.

13 Claims, 9 Drawing Sheets

ELECTRICALLY ERASABLE AND PROGRAMMABLE READ ONLY MEMORY DEVICE WITH ERASE VERIFY CIRCUIT FOR EXACTLY VERIFYING ERASED STATE OF MEMORY CELLS

FIELD OF THE INVENTION

This invention relates to an electrically erasable and programmable read only memory device and, more particularly, to an electrically erasable and programmable read only memory device operative as a flash memory.

DESCRIPTION OF THE RELATED ART

A floating gate field effect transistor is a typical circuit component of an electrically erasable and programmable read only memory device, and varies the threshold depending upon the amount of electric charge accumulated in the floating gate electrode. Assuming now that the floating gate type field effect transistor is of the n-channel type, when electrons are injected from the drain region into the floating gate electrode, the floating gate type field effect transistor enters into a write-in state, and the injected electrons gives rise to increase of the transistor threshold. On the other hand, when the electron is evacuated from the floating gate electrode to the source region, the floating gate type field effect transistor enters into an erased state, and the threshold decreases. The high threshold and the low threshold correspond to the logic levels, and the floating gate type field effect transistor stores a data bit.

The floating gate type field effect transistors form a plurality of memory blocks, and a byte or a word is concurrently written into each of the memory blocks. On the other hand, all of the data bits are concurrently erased from all of the memory blocks. If the memory blocks are arranged into sectors, the sectors are selectively erased.

Although the floating gate type field effect transistors are fabricated through a process sequence, the data erasing characteristics are not equal due to uneven process parameters, and the floating gate type field effect transistors unevenly vary the thresholds. In other words, even if the floating gate type field effect transistors are concurrently subjected to the erasing operation under the same conditions, all of the thresholds do not reach a target level, and are dispersed in a threshold range. Thus, high-speed erasable transistors and low-speed erasable transistors are mixed in the memory blocks.

If the erasing operation is prolonged for the low-speed erasable transistors, the high-speed erasable transistors enter into an excessively erased state, and the thresholds thereof become negative. The floating gate type field effect transistor with the negative threshold is operative in the depletion mode.

A the floating gate type field effect transistor with a negative threshold allows current to flow therethrough at all times and destroys a read-out data bit. Thus, the excessively erased state is undesirable for the electrically erasable and programmable read only memory device. An erase/verify operation is effective against the excessively erased state.

FIG. 1 illustrates a typical example of the electrically erasable and programmable read only memory device changed to the erased state through the erase/verify operation.

The electrically erasable and programmable read only memory device comprises a memory cell array 1, and a plurality of memory cell blocks 11 to 1m are incorporated in the memory cell array 1. Word lines WL1 to WLm are respectively associated with the memory cell blocks 11 to 1m, and bit lines BL1, BL2 and BLn are shared among the memory cell blocks 11 to 1m.

N-channel floating gate type field effect transistors M11 to M1n form in combination each of the memory cell blocks 11 to 1m. The word lines WL1 to WLm are respectively connected to the control gate electrodes of the associated memory cell blocks 11 to 1m, and the bit lines BL1 to BLn are respectively connected to the drain nodes of the n-channel floating gate type field effect transistors M11 to M1n of each memory cell block 11/1m. A source line S is connected to the source nodes of all the n-channel floating gate type field effect transistors.

The electrically erasable and programmable read only memory device further comprises a row address decoder unit 2a, a column address decoder unit 2b, a column selector unit 2c and a sense amplifier unit 3.

The row address decoder unit 2a is responsive to row address signals so as to select one of the word lines WL1 to WLm. The selected word line is changed to a read-out level VR in a read-out mode and a verify level VVRa in a verify phase of the erase/verify mode, and all the word lines WL1 to WLm are changed to inactive level in the presence of an erasing pulse control signal ER.

The column selector unit 2c includes a plurality of n-channel enhancement type transfer transistors Qn1 to Qnn coupled between the bit lines BL1 to BLn and the sense amplifier unit 3, and the column address decoder unit 2b includes inverters INV1 connected through control lines CL1, CL2, . . . and CLn to the gate electrodes of the n-channel enhancement type transfer transistors Qn1 to Qnn.

The column address decoder unit 2b is responsive to the column address signals in the read-out mode and the verify phase of the erase/verify mode so as to change one of the control lines CL1 to CLn to an active level, and causes one of the n-channel enhancement type transfer transistors Qn1 to Qnn to electrically connect the associated bit line to the sense amplifier unit 3. While the erase pulse control signal ER is in the active level, the column address decoder unit 2b maintains all the control lines CL1 to CLn at the inactive level, and all of the n-channel enhancement type transfer transistors Qn1 to Qnn are turned off.

The sense amplifier unit 3 increases the potential change at an input node IN upon selection of the bit line, and generates an output data signal Dout.

The electrically erasable and programmable read only memory device further comprises an erasing pulse generating unit 4. The erasing pulse generating unit 4 is responsive to the erasing pulse control signal ER. When the erasing pulse control signal ER is changed to an active level, the erasing pulse generating unit 4 changes an erasing pulse signal EP from the ground level to a positive high level Vh for a predetermined time period, and the erasing pulse signal EP is transferred through the source line S to the source nodes of the n-channel floating gate type field effect transistors M11 to M1n of all the memory cell blocks 11 to 1m. The predetermined time period is much shorter than the time period for the excessively erased state. While the erasing pulse control signal ER is in the inactive level, the erasing pulse generating unit 4 maintains the source line S at the ground level.

The prior art electrically erasable and programmable read only memory device behaves in the erase/verify mode as follows. FIG. 2 illustrates the erase/verify operation.

An erasing instruction from an eraser (not shown) initiates the erase/verify operation, and the erasing pulse control signal ER is changed to the active level as by step SP1. The erasing pulse control signal ER causes the row address decoder unit 2a and the column address decoder unit 2b to change the word lines WL1 to WLm and the control lines CL1 to CLn to the inactive level, and the n-channel floating gate type field effect transistors M11 to M1n enter into floating state. The erasing pulse generating unit 4 raises the erasing pulse signal EP to the positive high level Vh, and supplies the erasing pulse signal EP through the source line S to the source nodes of all the n-channel floating gate type field effect transistors M11 to M1n. The erasing pulse signal EP of the positive high level Vh evacuates some of the electrons from the floating gate electrode of every n-channel floating gate type field effect transistor, and gives rise to decrease of the thresholds in all the n-channel floating gate type field effect transistors.

When the erasing pulse generating unit 4 recovers the erasing pulse signal EP to the ground level, the eraser device starts the verifying operation as by step SP2.

The verifying operation is similar to the read-out operation except for the word line potential. The row address decoder unit 2a changes a selected word line to the verify level VVRa, i.e., an intermediate potential level VVRa between the high threshold and the low threshold such as 3.5 volts.

In detail, the row address decoder unit 2a changes the word line WL1 to the verify level, and the column address decoder unit 2b changes the control line CL1 to the active level. Then, the bit line BL1 is connected through the n-channel enhancement type transfer transistor Qn1 to the sense amplifier unit 3, and the word line WL1 examines whether or not the n-channel floating gate type field effect transistor M11 enters into the erased state as by step SP3. If the threshold is still higher than the verify level VVRa, no current flows through the n-channel floating gate type field effect transistor M11 to the source line S, and the sense amplifier unit 3 does not detect the potential drop at the input node IN. The sense amplifier unit 3 gives the negative answer at step SP3. Then, the electrically erasable and programmable read only memory device returns to step SP1, and repeats the loop consisting of steps SP1 to SP3 until the answer at step SP3 is given affirmative.

When the n-channel floating gate type field effect transistor enters into the erased state, the n-channel floating gate type field effect transistor M11 allows current to flow into the source line S, and the sense amplifier unit 3 detects the potential drop at the input node IN due to the current. Then, the answer at step SP3 is changed to affirmative. The eraser checks the column address signals to see whether or not the column address signals reach the final column address. If the answer at step SP4 is negative, the eraser increments the column address as by step SP5, and returns to steps SP2. The n-channel floating gate type field effect transistor M12 is selected from the memory cell block 11, and the floating gate type field effect transistor M12 is examined to see whether or not the floating gate type field effect transistor M12 enters into 6he erased state. In this way, the n-channel floating gate type field effect transistors M11 to M1n of the memory cell block 11 are sequentially examined.

When the column address signals reach the final column address, the answer at step SP4 is affirmative, and the eraser proceeds to step 6 to see whether or not the row address signals reach the final row address. If the answer at step 6 is negative, the row address is incremented as by step SP7, and the selected word line is changed from WL1 to WL2. Thus, the row address decoder unit 2a sequentially changes the selected word line, and the sense amplifier unit 3 examines the n-channel floating gate type field effect transistors M11 to M1n of all the memory cell blocks 11 to 1m.

When the answer at step SP6 is affirmative, the eraser completes the erase/verify operation.

Thus, the first prior art electrically erasable and programmable read only memory device concurrently erases the n-channel floating gate type field effect transistors, and sequentially verifies the erased state for the individual n-channel floating gate type field effect transistors. However, the individual verifying operation is time consuming. Various speed-up technologies have been proposed.

One of the speed-up technologies is disclosed in Japanese Patent Publication of Unexamined Application No. 4-26996. FIG. 3 illustrates the circuit configuration of the second prior art electrically erasable and programmable read only memory device. The basic circuit configuration of the second prior art electrically erasable and programmable read only memory device is similar to that of the first prior art electrically erasable and programmable read only memory device. Signal lines and circuit components of the second prior art are labeled with the references designating the corresponding signal lines and the corresponding circuit components of the first prior art without detailed description.

In the first prior art electrically erasable and programmable read only memory device, the inverters INV1 form in combination the column address decoder unit 2b, and the inverters INV1 either maintain all the control lines CL1 to CLn in the inactive low level or raise one of the control lines CL1 to CLn to the active high level.

On the other hand, two-input NAND gates NA1 form in combination the column address decoder unit 2b' incorporated in the second prior art electrically erasable and programmable read only memory device. Address control signals are respectively supplied to the first input nodes of the two-input NAND gates NA1, and a verify control signal VR is supplied to the second input nodes of all the two-input NAND gates. While the second prior art electrically erasable and programmable read only memory device is operating in the write-in mode, the verify control signal VR is staying in the inactive high level, and the address control signals causes the two-input NAND gates NA1 to selectively change the control signal lines CL1 to CLn to the active level. On the other hand, when the second prior art electrically erasable and programmable read only memory device enters into the verifying phase, the verify control signal VR is changed to the active low level, and all the two-input NAND gates NA1 change the control lines CL1 to CLn to the active high level.

Another difference is a p-channel enhancement type field effect transistor Qp1 incorporated in the sense amplifier unit 3'. The p-channel enhancement type field effect transistor Qp1 is connected between a positive power voltage line and an input node of the output inverter INV2, and is gated by the verify control signal VR. When the verify control signal VR is changed to the active low level, the p-channel enhancement type field effect transistor Qp1 turns on, and increases the sensitivity of the sense amplifier unit 3'.

As described hereinbefore, the verify control signal VR causes the column address decoder unit 2b' to connect all the bit lines BL1 to BLn through the column selector unit 2c to the input node IN of the sense amplifier unit 3' in the verifying phase. The row address is sequentially changed, and the selected word line WL1/WLm allows the sense amplifier unit 3' to check the associated memory cell block 11 to 1m to determine whether or not the n-channel floating gate type field effect transistors M11 to M1n enter into the erased state.

If all the n-channel floating gate type field effect transistors M11 to M1n concurrently turn on, these field effect transistors M11 to M1n have already entered into the erased state, and a large amount of current widely drops the potential level at the input node IN.

However, if at least one n-channel floating gate type field effect transistor is turned off, the potential level at the input node IN is slightly higher than the potential level under the conditions that all the transistors M11 to M1n turn on. Therefore, the sense amplifier unit 3' is expected to discriminate such an extremely small potential difference, and the p-channel enhancement type field effect transistor Qp1 changes the sensitivity of the sense amplifier unit 3' in the verifying phase.

The column address decoder unit 2b' allows the sense amplifier unit 3' to concurrently verify the erased state for all the n-channel floating gate type field effect transistors forming each memory cell block, and makes the sequential increment on the column address unnecessary. As a result, the time period consumed in the verifying phase is surely shrunk. However, if one or two n-channel enhancement type field effect transistors remains non-erased, the potential difference at the input node IN is extremely small, and the sense amplifier unit 3' sometimes fails to discriminate such an extremely small potential difference, and the verify is not reliable.

FIG. 4 illustrates the third prior art electrically erasable and programmable read only memory device disclosed in Japanese Patent Publication of Unexamined Application No. 4-3395. The second prior art electrically erasable and programmable read only memory device concurrently checks the n-channel floating gate type field effect transistors M11 to M1n of each memory cell block M11/M1n as described hereinbefore. The third prior art electrically erasable and programmable read only memory device widens the object of the verifying operation, and the sense amplifier unit 3' concurrently checks all the n-channel floating gate type field effect transistors of the memory cell array 1 whether to be in the erased state or not.

The basic circuit configuration is also similar to the first prior art electrically erasable and programmable read only memory device, and signal lines and circuit components of the third prior art are labeled with the references designating the corresponding signal lines and the corresponding circuit components of the second prior art electrically erasable and programmable read only memory device without detailed description.

The row address decoder unit 2a' includes two-input NAND gates NA2. Address control signals are respectively supplied to the first input nodes of the two-input NAND gates NA2, and the second input nodes of the two-input NAND gates NA2 are assigned to the verify control signal VR. When the third prior art electrically erasable and programmable read only memory device enters into the verifying phase, the verify control signal VR causes the NAND gates NA1 and NA2 to raise the control lines CL1 to CLn and the word lines WL1 to WLm to the active level. As a result, all the bit lines BL1 to BLn are connected through the column selector unit 2c to the input node IN of the sense amplifier unit 3', and all the word lines WL1 to WLm allows the sense amplifier unit 3' to check concurrently all the memory cell blocks 11 to 1m to determine whether or not all the n-channel floating gate type field effect transistors enter into the erased state.

As described hereinbefore, the data erasing characteristics are not equal. If the word lines WL1 to WLm are changed to the intermediate potential level VVRa, non-erased n-channel floating gate type field effect transistors are left in the memory cell array 1. For this reason, the row address decoder unit 2a' is connected to a source of reference potential level 5, and the reference potential level is adjusted to around the minimum threshold level such as 2 volts. The row address decoder unit 2a' raises all the word lines WL1 to WLm to the reference potential level in the verifying phase, and all the n-channel floating gate type field effect transistors M11 to M1n are assumed to enter into the erased state when current flows into the source line S.

The third prior art electrically erasable and programmable read only memory device concurrently verifies the erased state for all the n-channel floating gate type field effect transistors, and needs not only the increment of the column address but also the increment of the row address. The erase/verify operation is completed within a time period shorter than that of the second prior art electrically erasable and programmable read only memory device. However, the reliability is low as similar to the second prior art electrically erasable and programmable read only memory device.

Yet another speed-up technology is disclosed in Japanese Patent Publication of Unexamined Application No. 3-259499. The fourth prior art electrically erasable and programmable read only memory device is illustrated in FIG. 5. The basis circuit configuration is similar to the first embodiment, and signal lines and circuit components of the fourth prior art are labeled with the references designating the corresponding signal lines and the corresponding circuit components of the first to third prior arts without detailed description.

Every j bit lines form a bit line group, and the bit lines BL11 to BLij are divided into i bit line groups. Column selector sub-units 21 to 2i are incorporated in a first-stage column selector unit 2ca, and the bit line groups BL11–BL1j to BLi1–BLij are respectively coupled to the column selector sub-units 21 to 2i.

A first-stage column address decoder unit 2ba controls the first-stage column selector unit 2ca, and each column selector sub-unit 21–2i selects a bit line from the associated bit line group.

Sense amplifier units 31 to 3i are respectively coupled to the column selector sub-units 21 to 2i, and rapidly increase potential levels on the selected bit lines, respectively.

The sense amplifier units 31 to 3i are coupled to a verifying circuit 6 and a second-stage column selector unit 2cb. While the fourth prior art electrically erasable and programmable read only memory device is operating in the read-out mode, a second-stage column address decoder unit 2bb causes the second-stage column selector unit 2ca to connect one of the sense amplifier units 31 to 3i to an output node OUT.

On the other hand, the second-stage column selector unit 2cb is closed in the erase/verify mode, and the row address decoder unit 2a changes one of the word lines WL1 to WLm to the active level. The first-stage column address decoder unit 2ba causes the first-stage column selector unit 2ca to connect i bit lines to the sense amplifier units 31 to 3i, respectively. The sense amplifier units 31 to 3i discriminates the potential levels at the selected bit lines. If all of the selected n-channel floating gate type field effect transistors have already entered into the erased state, the sense amplifier circuits 31 to 3i changes the potential levels at the input nodes IN1 to INi to the high level, and an AND gate AD1 of the verifying circuit 6 yields an output verifying signal of the high level. However, if at least one n-channel floating gate type field effect transistor remains non-erased, the AND gate AD1 maintains the output verifying signal in the low level. Thus, the verifying circuit 6 concurrently checks the potential levels at the input nodes IN1 to INi to determine whether or not all the n-channel floating gate type field effect transistors enter into the erased state.

The fourth prior art electrically erasable and programmable read only memory device repeats the erase/verify mode m times, and the erase/verify operation is longer than that of the third prior art electrically erasable and programmable read only memory device. However, the verifying circuit 6 is separated from the sense amplifier units 31 to 3$i$, and the verify is reliable.

However, the fourth prior art electrically erasable and programmable read only memory device requires i sense amplifier units and the verifying circuit 6, and these components occupy a large amount of area on the semiconductor chip. Moreover, the output data signal Dout is delivered from the second-stage column selector unit 2$cb$, and the output verifying signal is generated by the verifying circuit 6. The output data signal Dout and the output verifying signal complicate the circuit configuration.

SUMMARY OF THE INVENTION

It is therefore an important object of the present invention to provide an electrically erasable and programmable read only memory device which quickly completes the verifying operation at high reliability without a dual data output path.

To accomplish the object, the present invention proposes to vary the input node of a sense amplifier depending upon potential levels at selected bit lines by using a logic circuit.

In accordance with one aspect of the present invention, there is provided a non-volatile semiconductor memory device comprising: a memory cell array having a plurality of memory cells each changeable between an erased state with a first threshold and a write-in state with a second threshold different from the first threshold; an addressing system responsive to address signals so as to make the plurality of memory cells selectively accessible; a verify unit electrically connectable to first accessible memory cells selected from the memory cell array by the addressing system, and for determining whether the first accessible memory cells are in the erased state or not and for generating a control signal indicative of an entry into the erased state; and a sense amplifier unit connectable to at least one second accessible memory cell selected from the memory cell array by the addressing system for generating an output data signal indicative of either erased or write-in state of the at least one second accessible memory cell in the absence of the control signal, the sense amplifier unit being responsive to the control signal for generating an erase verify signal.

The non-volatile semiconductor memory device may further comprise an erasing unit and a write-in unit.

In accordance with another aspect of the present invention, there is provided a non-volatile semiconductor memory device comprising a sense amplifier and an erase verify circuit.

BRIEF DESCRIPTION OF THE DRAWINGS

The features and advantages of the electrically erasable and programmable read only memory device according to the present invention will be more clearly understood from the following description taken in conjunction with the accompanying drawings in which.

DESCRIPTION OF THE PREFERRED EMBODIMENTS

First Embodiment

Figure 6:
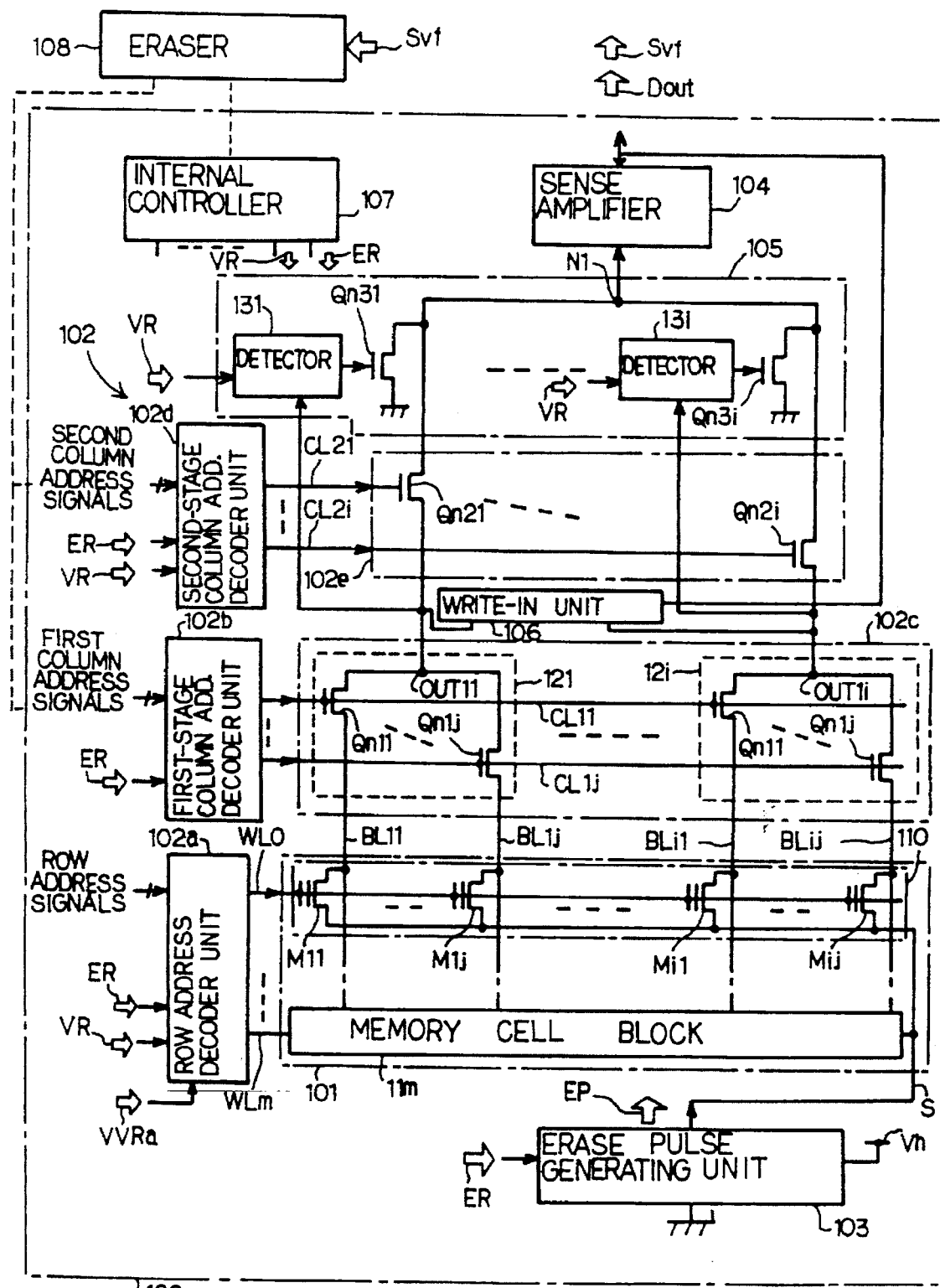
FIG. 6 is a circuit diagram showing the circuit configuration of an electrically erasable and programmable read only memory device according to the present invention.

Referring to FIG. 6 of the drawings, an electrically erasable and programmable read only memory device embodying the present invention is fabricated on a semiconductor chip 100, and has a write-in mode, a read-out mode and an erase/verify mode.

The electrically erasable and programmable read only memory device comprises a memory cell array 101, and a plurality of memory cell blocks 110 to 11$m$ are incorporated in the memory cell array 101. Word lines WL0 to WLm are respectively associated with the memory cell blocks 110 to 11$m$, and bit lines BL11 to BL1$j$ to BLi1 to BLij are shared among the memory cell blocks 110 to 11$m$. Every j bit lines form a bit line group, and i bit line groups BL11 to BL1$j$ to BLi1 to BLij are associated with the memory cell array 101.

N-channel floating gate type memory cell transistors M11 to M1$j$ and Mi1 to Mij form each of the memory cell blocks 110 to 11$m$, and a data bit is stored in each of the n-channel floating gate type memory cell transistors M11 to Mij.

The word lines WL1 to WLm are respectively connected to the control gate electrodes of the n-channel floating gate type memory cell transistors M11 to Mij of the associated memory cell blocks 110 to 11$m$. On the other hand, the bit lines BL11 to BL1$j$ to BLi1 to BLij are respectively connected to the drain nodes of the n-channel floating gate type memory cell transistors M11 to Mij to Mi1 to Mij of each memory cell block 11 to 1$m$. A source line S is connected to the source nodes of all the n-channel floating gate type memory cell transistors M11 to Mij.

Row addresses are respectively assigned to the memory cell blocks 110 to 11$m$ and, accordingly, the word lines WL0 to WLm. First column addresses are respectively assigned to the bit lines of each group, and the bit line groups are respectively assigned second column addresses. Therefore, each of the n-channel floating gate type memory cell transistors of the memory cell array 101 is specified by using the row address, the first column address and the second column address.

The electrically erasable and programmable read only memory device further comprises an addressing system 102, and the addressing system 102 makes the n-channel floating gate type memory cell transistors M10 to Mij selectively accessible. The addressing system 102 includes a row address decoder unit 102a, a first-stage column address decoder unit 102b, a first-stage column selector unit 102c, a second-stage column address decoder unit 102d and a second-stage column selector unit 102e.

The row address decoder unit 102a is connected to the word lines WL0 to WLm and selects one of the word lines WL0 to WLm. The row address decoder unit 102a is responsive to row address signals representative of the row address in the read-out mode and the write-in mode, and selects one of the word lines WL1 to WLm. The potential level on the selected word line depends on the mode of operation.

The selected word line is changed to a read-out level Vr in the read-out mode and to a write-in level Vw in the write-in mode. When an erase pulse control signal ER is changed to an active level, the row address decoder unit 102a maintains all the word lines WL0 to WLm in the ground level, and all the n-channel enhancement type transfer transistors Qn11 to Qn1j are turned off. On the other hand, when the verify control signal VR is changed to an active level, the row address decoder unit 102a changes the selected word line to a verify level VVRa.

The first-stage column selector unit 102c includes a plurality of column selector sub-units 121 to 12i, and n-channel enhancement type transfer transistors Qn11 to Qn1j form each of the column selector sub-units 121 to 12i. The bit line groups BL11 to BL1j to BLi1 to BLij are respectively associated with the column selector sub-units 121 to 12i, and the bit lines of each group are connected to the source/drain nodes of the n-channel enhancement type transfer transistors Qn11 to Qnj of the associated sub-unit.

The first-stage column address decoder unit 102b is connected through first control lines CL11 to CL1j to the column selector sub-units 121 to 12i. The first control line CL1 is connected to the gate electrodes of the n-channel enhancement type transfer transistors Qn11 of the column selector sub-units 121 to 12i, and the first control signal line CL1j is connected to the gate electrodes of the n-channel enhancement type transfer transistors Qn1j of the column selector sub-units 121 to 12i. The source/drain nodes of the n-channel enhancement type transfer transistors Qn11 to Qn1j of each sub-unit are coupled to an output node OUT11 to or OUT1i.

The first-stage column address decoder unit 102b is responsive to first column address signals representative of the first column address in the write-in mode, the readout mode and the verify phase of the erase/verify mode, and changes one of the first control lines CL11 to CL1j to an active level. The selected first control line selects an n-channel enhancement type transfer transistor Qn11 to or Q1j from each of the column selector sub-units 121 to 12i. The selected n-channel enhancement type transfer transistors Qn11/Qn1j electrically connect the associated bit lines to the output nodes OUT11 to OUT1j.

While the erase pulse control signal ER is in the active level, the first-stage column address decoder unit 102b maintains all the first control lines CL11 to CL1j at the inactive level, and all of the n-channel enhancement type transfer transistors Qn11 to Q1j are turned off.

N-channel enhancement type transfer transistors Qn21 to Qn2i form the second-stage column selector unit 102e, and the output nodes OUT11 to OUT1i are respectively connected to the source/drain nodes of the n-channel enhancement type field effect transistors Qn21 to Qn2i.

The second-state column address decoder unit 102d is connected through second control lines CL21 to CL2i to the gate electrodes of the n-channel enhancement type transfer transistors Qn21 to Qn2i.

The second-stage column address decoder unit 102d is responsive to second column address signals representative of the second column address in the read-out mode, and selectively changes the second control lines CL21 to CL2i to the active level. The selected second control line CL21/CL2i causes the n-channel enhancement type transfer transistor Qn21/Qn2i to turn on, and the second-stage column selector unit 102e becomes conductive to one of the output nodes OUT11 to OUT1i.

When the erasing pulse control signal ER or the verify control signal VR is changed to the active level, the second-state column address decoder unit 102d changes all the second control lines CL21 to CL2i to the inactive level, and causes the n-channel enhancement type transfer transistors Qn21 to Qn2i to turn off.

The electrically erasable and programmable read only memory device further comprises an erase pulse generating unit 103 which is coupled through the source line S to the source nodes of all the n-channel floating gate type memory cell transistors M11 to Mij.

The erase pulse generating unit 103 is responsive to the erasing pulse control signal ER. While the erasing pulse control signal ER stays at an inactive level, the erase pulse generating unit 103 connects the source line S to the ground line.

On the other hand, when the erasing pulse control signal ER is changed to the active level, the erase pulse generating unit 103 supplies an erasing pulse signal EP of a positive high level Vh to the source line S, and the erasing pulse signal EP applies the positive high level Vh to the source nodes of the n-channel floating gate type memory cell transistors M11 to Mij for a time period equal to the pulse width. The time period is so short that the n-channel floating gate type memory cell transistors M11 to Mij are not changed to the depletion mode.

While the erase pulse generating unit 103 is maintaining the source line at the positive high level Vh, the Fowler-Nordheim tunneling current flows from the floating gate electrodes to the source line S, and accumulated electrons are evacuated from the floating gate electrodes.

Figure 1:
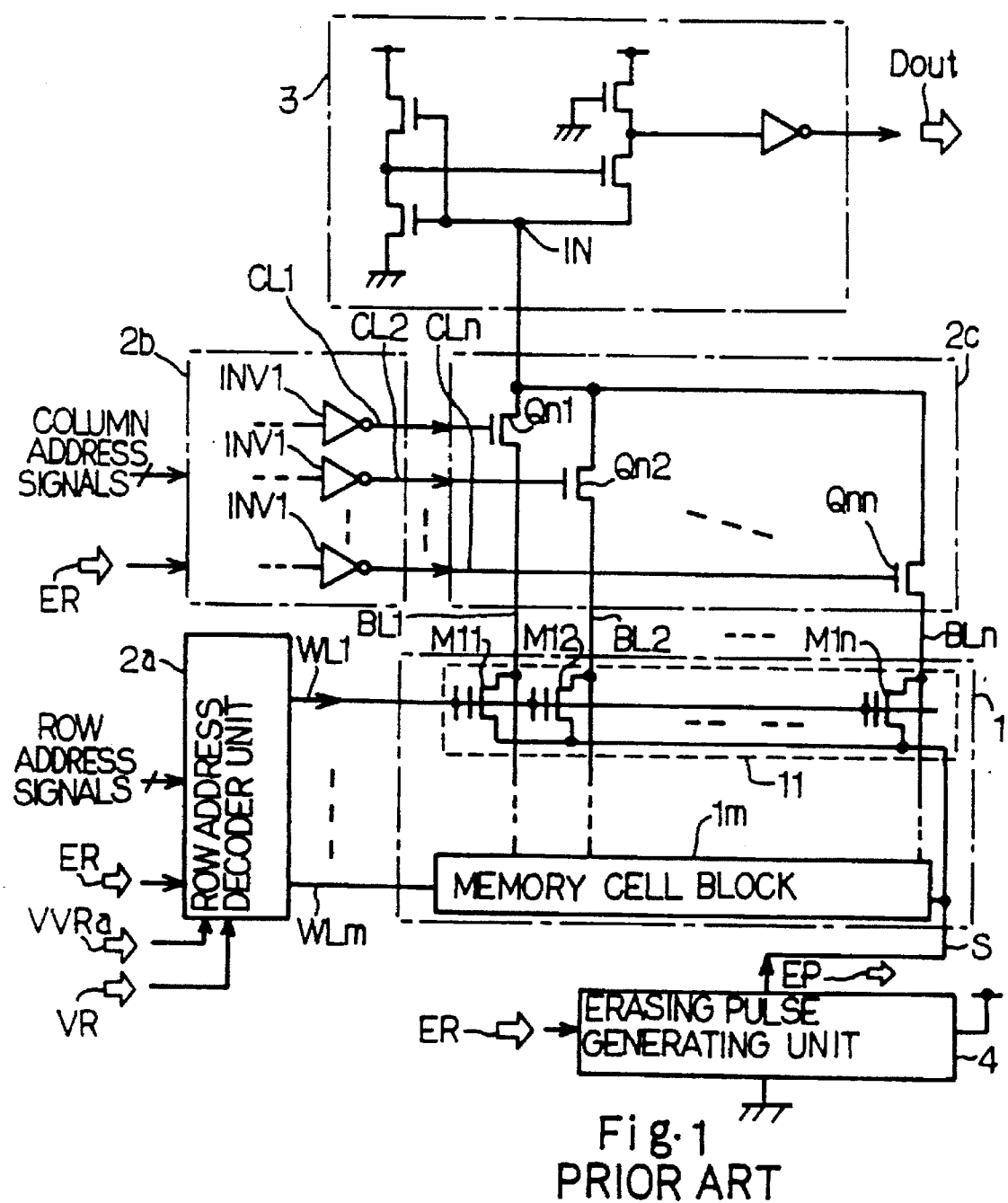
FIG. 1 is a circuit diagram showing the circuit configuration of the first prior art electrically erasable and programmable read only memory device.
Figure 2:
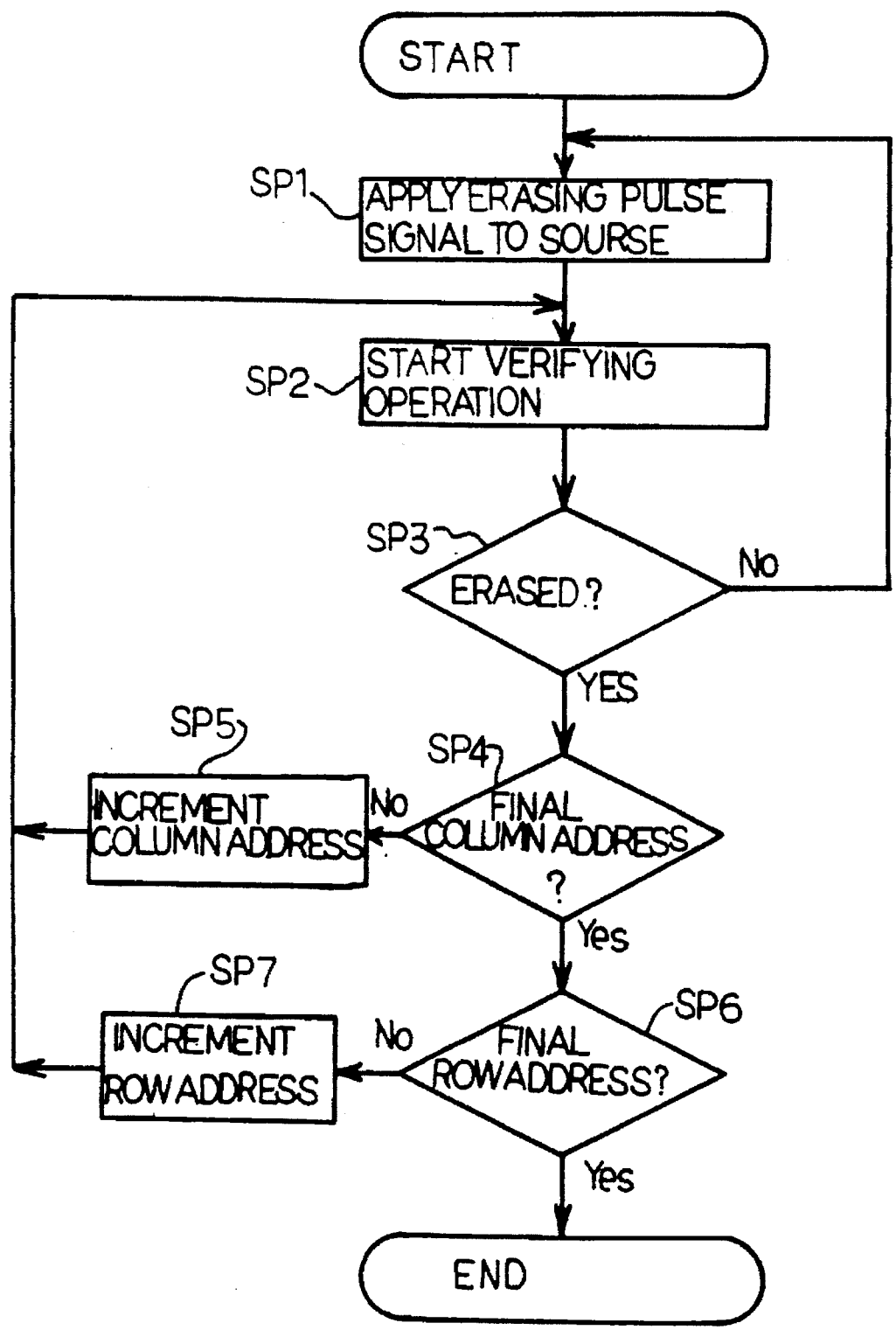
FIG. 2 is a flow chart showing the erasing/verifying operation of the first prior art electrically erasable and programmable read only memory device.
Figure 3:
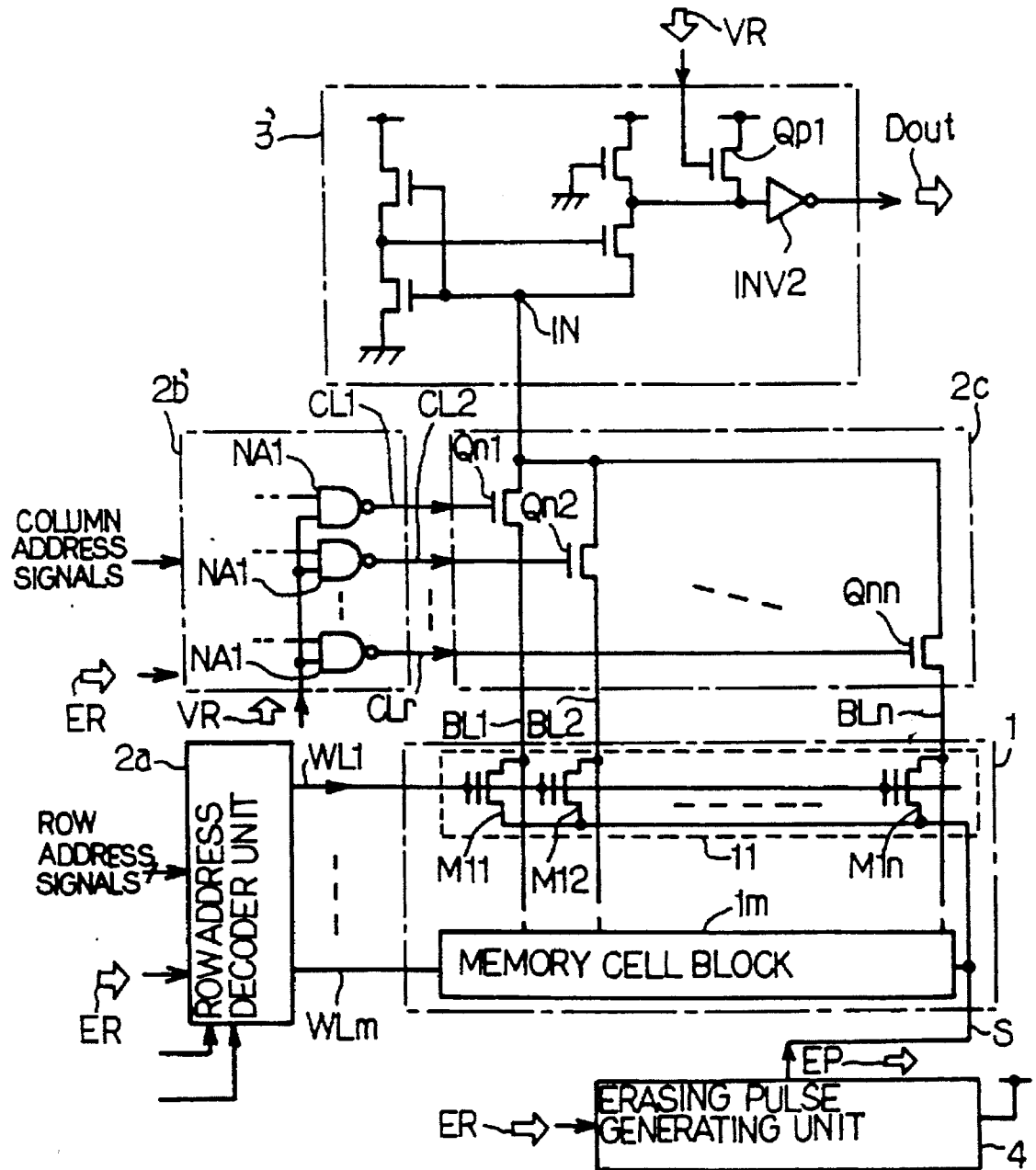
FIG. 3 is a circuit diagram showing the circuit configuration of the second prior art electrically erasable and programmable read only memory device.
Figure 4:
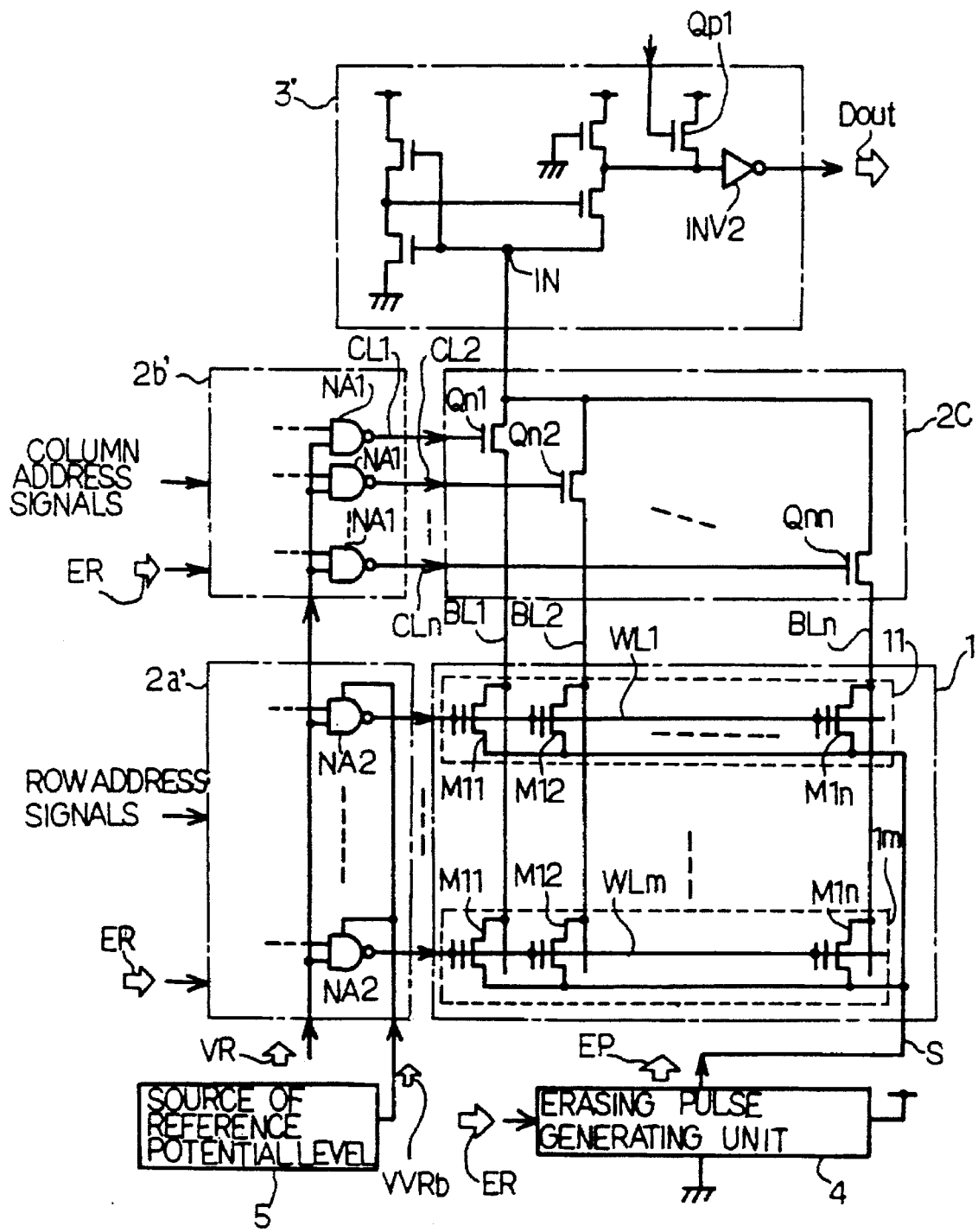
FIG. 4 is a circuit diagram showing the circuit configuration of the third prior art electrically erasable and programmable read only memory device.
Figure 5:
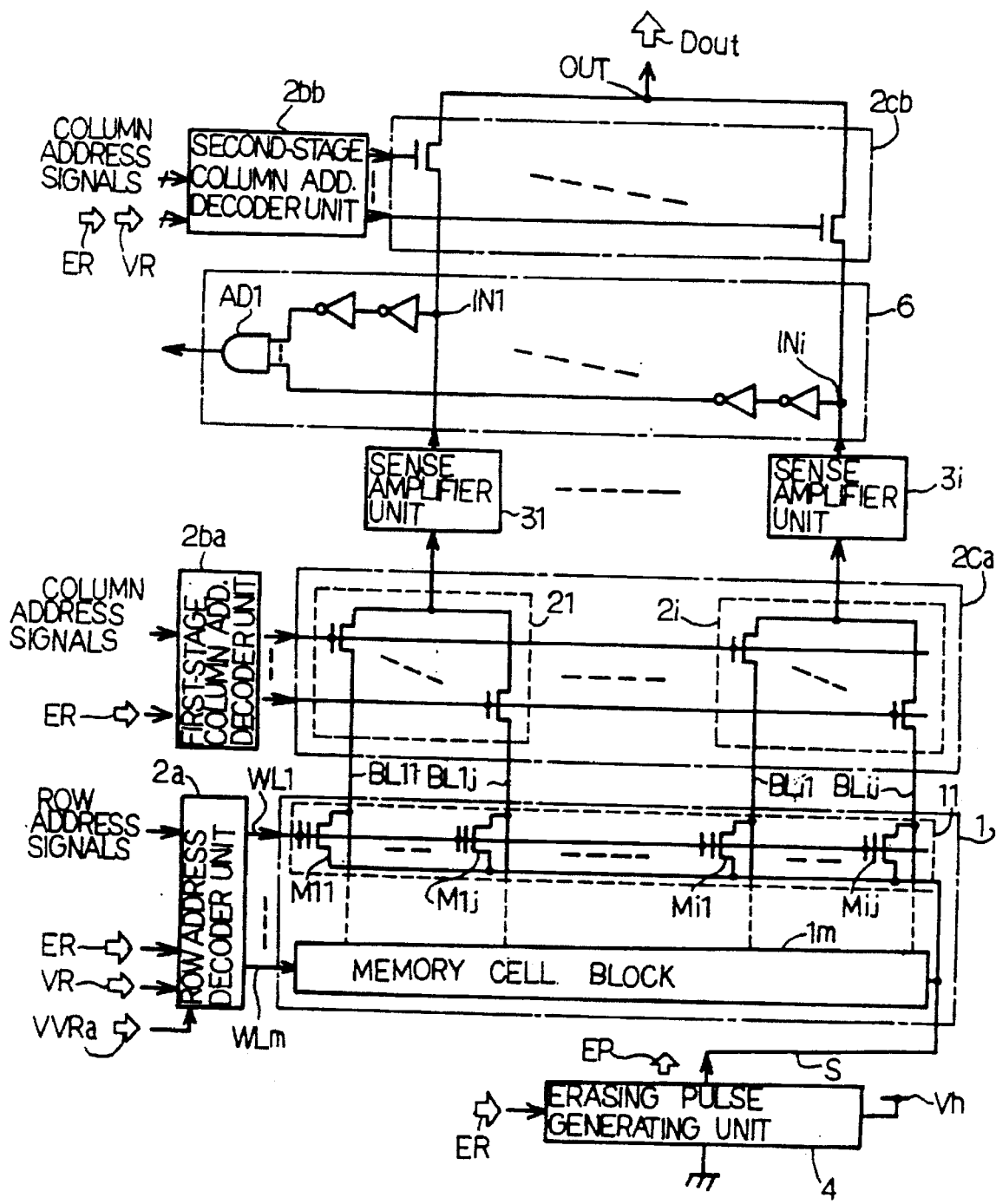
FIG. 5 is a circuit diagram showing the circuit configuration of the fourth prior art electrically erasable and programmable read only memory device.

The electrically erasable and programmable read only memory device further comprises a sense amplifier unit 104. The sense amplifier unit 104 is connected through a potential node N1 and the second-stage column selector unit 105 to the output nodes OUT11 to OUT1i, and develops a potential variation at the potential node N1 at high speed. In this instance, the sense amplifier unit 104 is similar in circuit configuration to the sense amplifier unit 3 shown in FIG. 1.

The electrically erasable and programmable read only memory device further comprises a verify unit 105. The verify unit verifies the erased state for the n-channel floating gate type memory cell transistors selected by the word lines WL0 to WLm and the first-stage column selector unit 102c in the erase/verify mode. The verify unit 105 includes a plurality of potential detectors 131 to 13i and a plurality of n-channel enhancement type discharging transistors Qn31 to Qn3i.

The potential detectors 131 to 13i are enabled with the verify control signal VR, and monitor the potential levels at the output nodes OUT11 to OUT1i, respectively.

Figure 7:
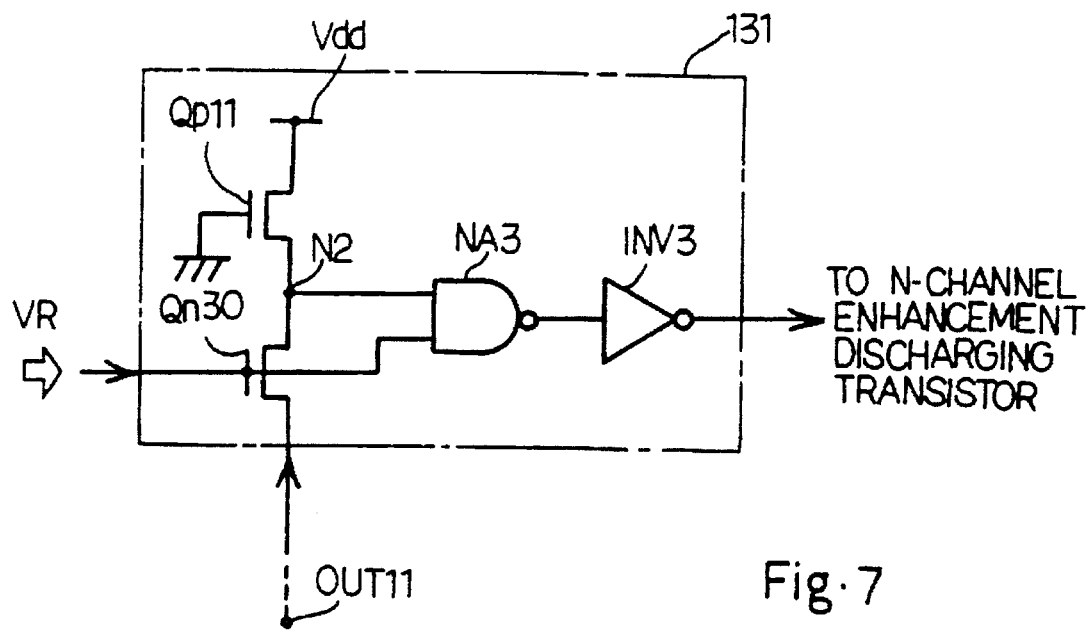
FIG. 7 is a circuit diagram showing the circuit configuration of a potential detector incorporated in the electrically erasable and programmable read only memory device shown in FIG. 6.

FIG. 7 illustrates the circuit configuration of the potential detector 131. The other potential detectors 13i are similar in circuit configuration to the potential detector 131. The potential detector 131 includes a series combination of a p-channel enhancement type load transistor Qp11 and an n-channel enhancement type switching transistor Qn30 coupled between a positive power voltage line Vdd and the associated output node OUT11, a two-input NAND gate NA3 and an inverter INV3. The gate electrode of the p-channel enhancement type load transistor Qp11 is grounded, and the verify control signal VR is supplied to the gate electrode of the n-channel enhancement type switching transistor Qn30 and one of the input nodes of the NAND gate NA3. A potential node N2 is provided between the p-channel enhancement type load transistor Qp11 and the n-channel enhancement type switching transistor Qn30, and is connected to the other input nodes of the NAND gate NA3. The output node of the NAND gate NA3 is connected to the input node of the inverter INV3, and the inverter INV3 controls the n-channel enhancement type discharging transistor Qn31.

While the verify control signal VR is in the inactive low level, the n-channel enhancement type switching transistor Qn30 isolates the output node OUT11 from the positive power voltage line Vdd, and the NAND gate NA3 causes the inverter INV3 to keep the n-channel enhancement type discharging transistor Qn31 off. Therefore, only the sense amplifier 104 supplies current through the secondstage column selector unit 102e to selected one of the output nodes OUT11 to OUT1i.

On the other hand, when the verify control signal VR is changed to the active high level, the positive power voltage line Vdd supplies current through the p-channel enhancement type load transistor Qp11 and the n-channel enhancement type switching transistor Qn30 to the output node OUT11, and the NAND gate NA3 is enabled.

While the n-channel floating gate type memory transistor coupled to the output node OUT11 remains non-erased, no current flows through the potential node N2, and the NAND gate NA3 yields the low level at the output node thereof, and the inverter INV3 causes the n-channel enhancement type discharging transistor Qn31 to turn on.

However, if the current flows through the n-channel floating gate type memory transistor to the source line S, the current varies the potential level at the potential node N2, and the NAND gate NA3 monitors the potential drop at the potential node N2. When the potential level at the node N2 becomes lower than the threshold of the NAND gate NA3, the NAND gate NA3 changes the output node thereof to the high level, and the inverter INV3 causes the n-channel enhancement type discharging transistor Qn31 to turn off.

Thus, the n-channel enhancement type discharging transistors Qn31 to Qn3i changes the potential level at the node N1 in the verifying operation on the basis of the status of the selected n-channel floating gate type memory transistors. When all the selected n-channel floating gate type memory transistors enter into the erased state, the potential node N1 rises, and the sense amplifier unit 104 generates an erase verify signal Svf.

The NAND gate NA3 is only expected to detect the potential drop at the node N2, and the manufacturer easily determines the threshold of the NAND gates NA3. For this reason, the NAND gate NA3 can discriminate the potential drop at the entry of the associated n-channel floating gate type memory transistor into the erased state, and the verify unit 105 changes the potential level at the node N1 to the high level when all the selected n-channel floating gate type memory transistors enters into the erased state. The sense amplifier unit 104 responds to the high level at the node N1, and generates an erase verify signal Svf. The erase verify signal Svf is highly reliable.

Although the potential detectors 131 to 13i and the n-channel enhancement type discharging transistors Qn31 to Qn3i are newly added, the potential detectors 131 to 13i and the n-channel enhancement type discharging transistors Qn31 to Qn3i occupy less area than the sense amplifier units 31 to 3i. The sense amplifier units 31 to 3i are expected to verify not only the erased state in the verify operation but also the sense amplification in the read-out mode. In order to complete the sense amplification at high speed, large component transistors form the sense amplifier unit, and, accordingly, the sense amplifier units 31 to 3i occupy wide area. However, the potential detectors 131 to 13i and the n-channel enhancement type discharging transistors Qn31 to Qn3i are not expected to complete the verify operation at high speed, and small transistors form the potential detectors 131 to 13i. For this reason, the electrically erasable and programmable read only memory device does not consume wider area rather than the fourth prior art electrically erasable and programmable read only memory device.

The electrically erasable and programmable read only memory device further comprises a write-in circuit 106 and an internal controller 107. Write-in data bits are serially supplied to the write-in circuit 106 in the write-in mode, and the write-in circuit 106 supplies them in parallel to the output nodes OUT11 to OUT1i. Namely, the write-in circuit 106 selectively supplies a write-in level to the output nodes OUT11 to OUT1i depending upon the logic levels of the write-in data bits. The internal controller 107 sequentially generates internal control signals such as the erase pulse control signal ER and the verify control signal VR.

The electrically erasable and programmable read only memory device behaves as follows.

In the write-in mode, the row address decoder unit 102a changes one of the word lines WL0 to WLm assigned the row address specified by the row address signals to the write-in level Vw, and the first-stage column address decoder unit 102b changes one of the first control lines CL11 to CL1j assigned the first column address specified by the first column address signals to the active level. The write-in data bits are serially supplied from the outside to the write-in unit 106, and the write-in unit 106 selectively supplies the write-in level through the selected bit lines to the drain nodes of the selected n-channel floating gate type field effect transistors. The write-in voltage reversely biases the p-n junction between the drain node and the semiconductor chip 100, and the p-n junction generates electron-hole pairs. The electrons are attracted toward the floating gate electrode in the presence of the electric field created by the control gate electrode and accumulate in the floating gate electrode. The accumulated electrons increase the threshold of the n-channel floating gate type memory transistor, and the n-channel floating gate type memory transistor enters the write-in state.

In the read-out mode, the row address decoder unit 102a changes one of the word lines WL0 to WLm to the read-out level Vr, and the first-stage column address decoder unit 102b and the second-stage column address decoder unit 102d cause the first-stage column selector 102c and the second-stage column selector 102e to connect the potential node N1 to one of the n-channel floating gate type memory transistor M11 to Mij. The sense amplifier unit 104 supplies current to the selected n-channel floating gate type memory transistor and determines whether the memory transistor is in the erased state or the write-in state on the basis of the potential level at the node N1. The sense amplifier unit 104 generates the output data signal Dout indicative of the present status of the selected n-channel floating gate type memory transistor.

Figure 8:
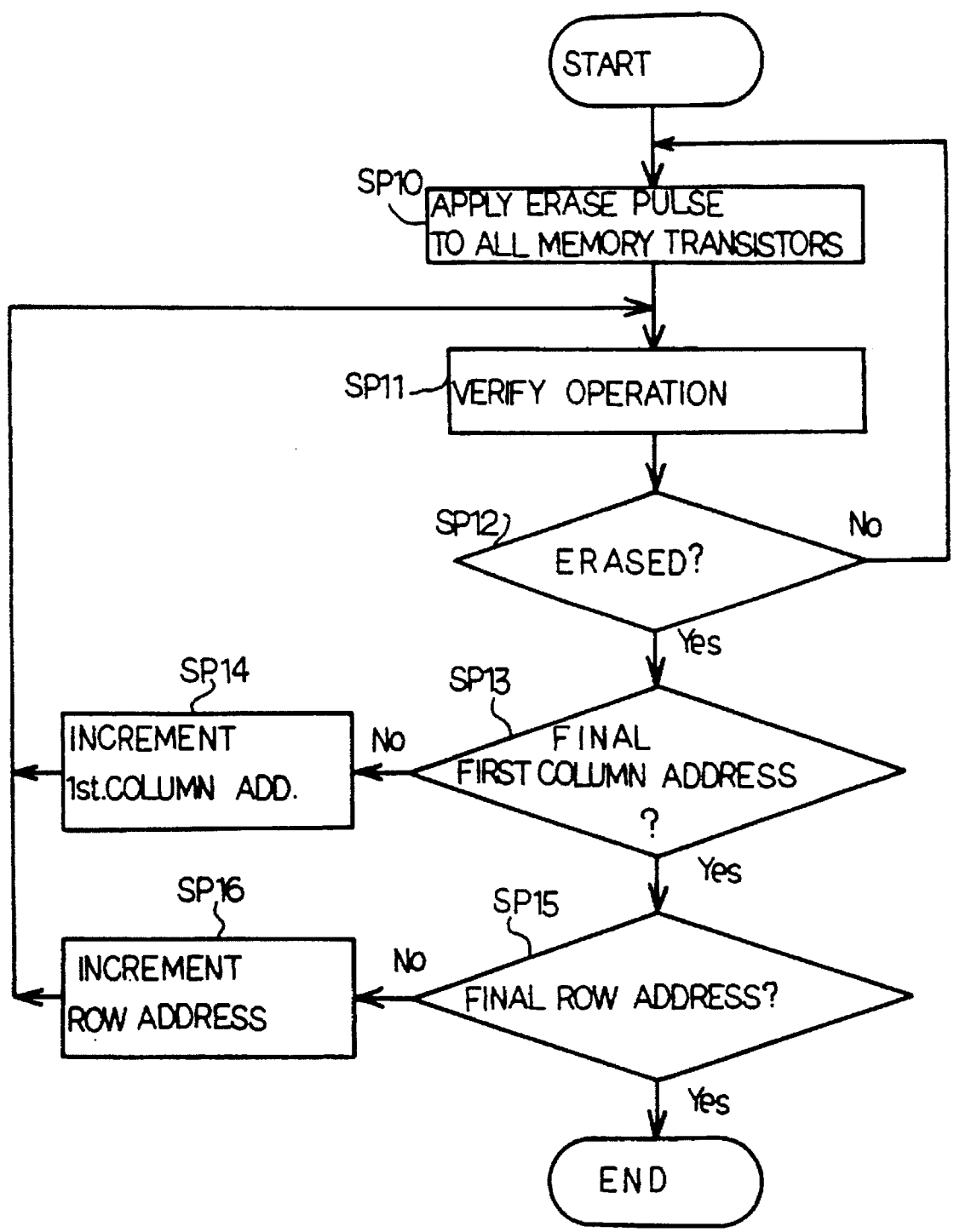
FIG. 8 is a flow chart showing an erase/verify operation executed by the electrically erasable and programmable read only memory device.

FIG. 8 illustrates an erase/verify sequence executed by the electrically erasable and programmable read only memory device. When an external eraser 108 is connected to the electrically erasable and programmable read only memory device, the electrically erasable and programmable read only memory device enters into the erase/verify mode, and the erase pulse control signal ER is changed to the active level.

The first-state column address decoder unit 102b and the second-stage column address decoder unit 102d maintain all the first control lines CL11 to CLij and the second control lines CL21 to CL2i at the inactive level, and the bit lines BL11 to BLij enter into the floating state.

The erase pulse generating unit 103 responds to the erase pulse control signal ER and supplies the erase pulse signal EP through the source line S to the source nodes of all the n-channel floating gate type memory transistors M11 to Mij as by step SP10. The erase pulse signal EP gives rise to Fowler-Nordheim tunneling phenomenon, and the electrons are partially evacuated from the floating gate electrodes. As a result, the n-channel floating gate type memory transistors M11 to Mij lower thresholds. The erase pulse control signal ER is returned to the inactive level.

Subsequently, the verify control signal VR is changed to the active level, and the second-stage column address decoder unit 10d maintains all the second control lines CL21 to CL2i at the inactive level. As a result, the output nodes OUT11 to OUT1i are electrically isolated from the potential node N1.

The electrically erasable and programmable read only memory device starts the verify operation on i n-channel floating gate type memory transistors as by step SP11.

In detail, the row address decoder unit 102a selects the word line WL0, and the first-stage column address decoder unit 102b selects the first control line CL11. The row address decoder unit 102a applies the potential level VVRa to the selected word line WL0, and the first-stage column selector unit 102c connects the bit lines BL11 to BLi1 to the output nodes OUT11 to OUT1i. The n-channel floating gate type memory transistors M11 to Mi1 are selected from the memory cell array 101.

Subsequently, the verify unit 105 checks the status of the selected n-channel floating gate type memory transistors M11 to Mi1 as by step SP12.

In detail, the verify control signal VR has already activated the potential detectors 131 to 13i. Current flows through the current path formed by the p-channel enhancement type load transistors Qp11 the n-channel enhancement type switching transistor Qn30, and the n-channel enhancement type transfer transistors Qn11, and the selected n-channel floating gate type memory transistors M11 to Mi1. While all the selected n-channel floating gate type memory transistors M11 to Mi1 remain non-erased, no current flows into the source line S, and the nodes N2 are at the high level. The potential detectors 131 to 13i cause the n-channel enhancement type discharging transistors Qn31 to Qn3i to be turned on, and the sense amplifier 104 maintains the erase verify signal Svf inactive.

Assuming that the selected n-channel floating gate type memory transistors are erased except for the memory transistor M11, the erased n-channel floating gate type memory transistors turn on so as to discharge the current to the source line, and the non-erased n-channel floating gate type memory transistor M11 does not allow the current to pass therethrough. The output node OUT11 maintains the potential level high, but the other output nodes OUTi are decayed to the low level. The potential detector 131 maintains the n-channel enhancement type discharging transistor Qn31 in the on-state, and, for this reason, the potential node N1 still remains low.

In this situation, the answer at step SP12 is negative, and the electrically erasable and programmable read only memory device returns to step SP10. The electrically erasable and programmable read only memory device repeats the loop consisting of steps SP10 to SP12 until the answer at step SP12 is changed to positive.

When all the selected n-channel floating gate type memory transistors M11 to Mi1 enter into the erased state, the potential level at the node N1 is changed to the high level, and the sense amplifier 104 changes the erase verify signal Svf to the active level. With the erase verify signal Svf of the active level, the answer at step SP12 is changed to positive, and the external eraser 108 checks the first column address signals to see whether or not the first column address reaches the final value as by step SP13. The first column address signals have specified the first control line CL11, and the answer is negative. The external eraser 108 increments the first column address, and returns to step SP11. The first-stage column address decoder unit 102b changes the next first control line to the active level. However, the row address decoder unit 102a maintains the word line WL0.

The steps SP11 and SP12 are repeated for the selected n-channel floating gate type memory transistors, and the step SP10 is carried out, if necessary. When the external eraser 108 completes the verify operation on the selected n-channel floating gate type memory transistors M1j to Mij of the memory cell block 110, the answer at step SP13 is affirmative, and the external eraser 108 checks the first column address signals to see whether or not the first column address reaches the final value as by step SP15. The row address decoder unit 102a selects the word line WL0, and the answer at step SP15 is negative, and the external eraser 108 increments the row address as by step SP16.

The external eraser 108 returns to step SP10, and repeats the loop consisting of steps SP11 to SP16 and step SP10, if necessary. When the selected n-channel floating gate type memory transistors M1j to Mij of the memory cell block 11m enter into the erased state, the answers at steps SP13 and SP15 are affirmative, and the external eraser 108 terminates the erase/verify operation.

As will be appreciated from the foregoing description, the electrically erasable and programmable read only memory device concurrently verifies the erased state for j memory transistors, and the time consumed in the verify operation is less than that of the first prior art electrically erasable and programmable read only memory device.

Each NAND gate NA3 monitors only one selected n-channel floating gate type memory transistor, and easily discriminates the entry into the erased state. The potential level at the node N1 is changed to the high level only when all the selected n-channel floating gate type memory transistors enter into the erased state. Therefore, the standard sense amplifier unit exactly discriminates the entry of all the n-channel floating gate type memory transistors into the erased state, and the erase verify signal is reliable.

Finally, the component transistors of the potential detectors and the associated n-channel enhancement type discharging transistors are so small that the occupation area is narrower than that of the sense amplifier units of the fourth prior art electrically erasable and programmable read only memory device.

Second Embodiment

Figure 9:
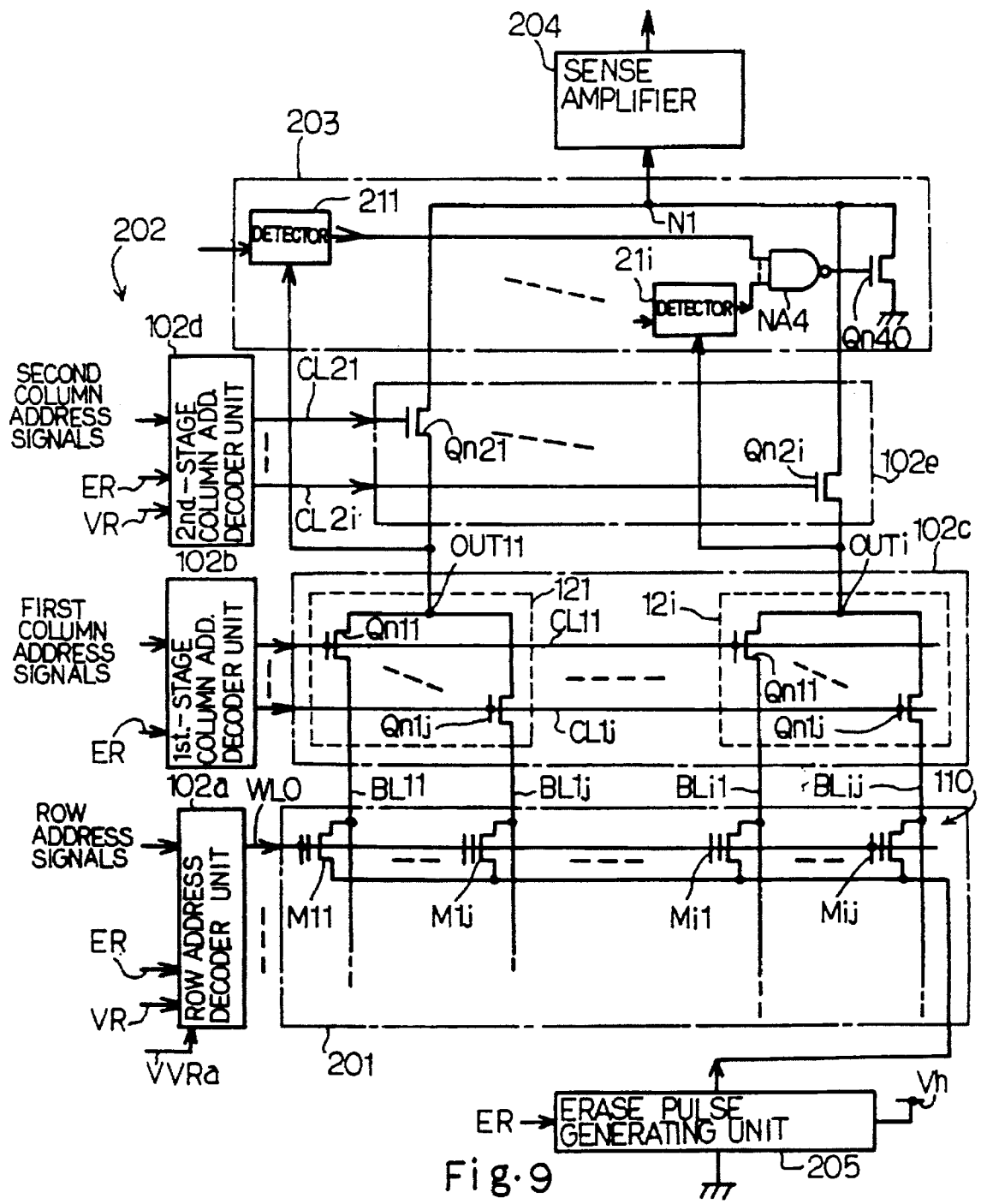
FIG. 9 is a circuit diagram showing the circuit configuration of another electrically erasable and programmable read only memory device according to the present invention.

Turning to FIG. 9, another electrically erasable and programmable read only memory device comprises a memory cell array 201, an addressing system 202, a verify unit 203, a sense amplifier unit 204, an erase pulse generating unit 205, a write-in unit (not shown) and an internal controller (not shown). The memory cell array 201, the addressing system 202, the sense amplifier unit 204, the erase pulse generating unit 205, the write-in unit and the internal controller are similar to those of the first embodiment, and signal lines and circuit components are labeled with the references designating the corresponding signal lines and the corresponding circuit components without detailed description.

Figure 10:
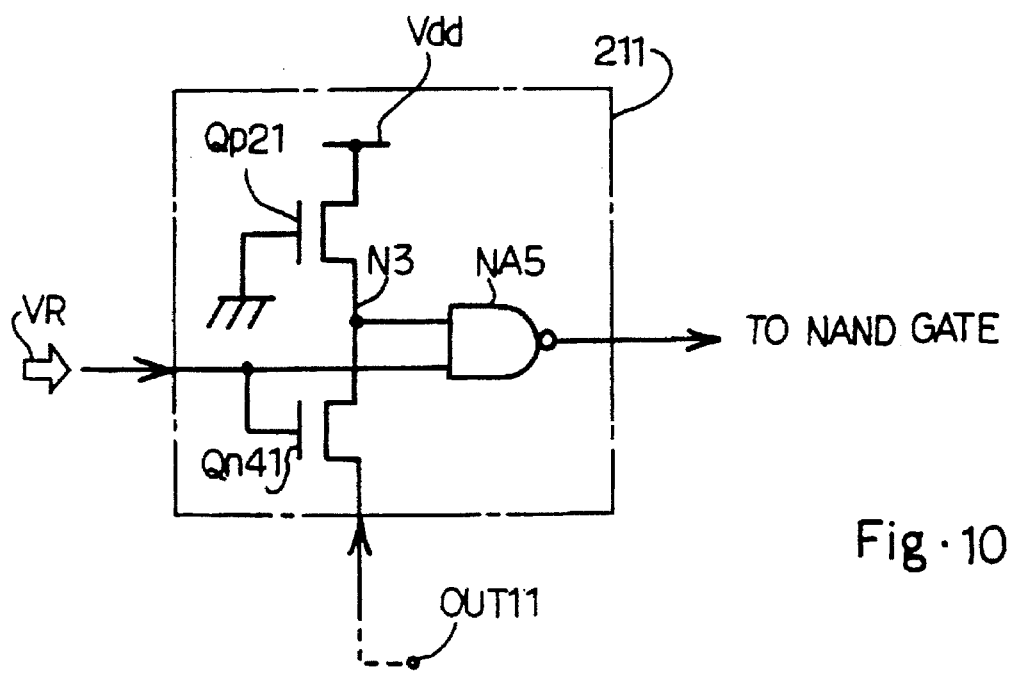
FIG. 10 is a circuit diagram showing the circuit configuration of a potential detector incorporated in the electrically erasable and programmable read only memory device shown in FIG. 9.

The verify unit 203 includes a plurality of potential detectors 211 to 21i, a NAND gate NA4 and an n-channel enhancement type discharging transistor Qn40. The plurality of potential detectors 211 to 21i are similar in circuit configuration to one another, and are slightly simplified over the potential detectors 131 to 13i. In detail, as shown in FIG. 10 the potential detector 211 has a series combination of a p-channel enhancement type load transistor Qp21 and an n-channel enhancement type switching transistor Qn41 coupled between the positive power voltage line Vdd and the output node OUT11 and a NAND gate NA5 enabled with the verify control signal VR and monitors a potential node N3. The difference between the potential detectors 131 and 211 is the inverter INV3.

The output nodes of the NAND gates NA5 are connected to the input nodes of the NAND gate NA4, and the NAND gate NA4 controls the n-channel enhancement type discharging transistor Qn40.

The potential detectors 211 to 21i are enabled with the verify control signal VR, and the NAND gate NA4 causes the n-channel enhancement type discharging transistor Qn40 to turn off only when all the selected n-channel floating gate type memory transistors enter into the erased state.

The electrically erasable and programmable read only memory device achieves all the advantages of the first embodiment. Moreover, the verify unit 203 is simpler than the verify unit 105, and the occupation area is less than that of the verify unit 105.

Although particular embodiments of the present invention have been shown and described, it will be obvious to those skilled in the art that various changes and modifications may be made without departing from the spirit and scope of the present invention.

For example, the electrically erasable and programmable read only memory device may form a part of an ultra large scale integration together with other function blocks. The electrically erasable and programmable read only memory device may be fabricated on a plurality of semiconductor chips. An electrically erasable and programmable read only memory device may multiply the memory cell array so as to generate a multi-bit output data signal.

What is claimed is:

1. A non-volatile semiconductor memory device comprising:

a memory cell array having a plurality of memory cells, each memory cell changeable between an erased state with a first threshold and a write-in state with a second threshold different from said first threshold;

an addressing system responsive to address signals so as to make said plurality of memory cells selectively accessible;

a verify unit, electrically connectable to at least one first accessible memory cell selected from said memory cell array by said addressing system, for determining whether said at least one first accessible memory cell is in said erased state, and for generating a control signal indicative of an entry into said erased state; and a sense amplifier unit, connectable to at least one second accessible memory cell selected from said memory cell array by said addressing system, for generating, in the absence of said control signal, an output data signal indicative of whether said at least one second accessible memory cell is in said erased state or said write-in state, said sense amplifier unit generating, in response to said control signal, an erase verify signal.

2. The non-volatile semiconductor memory device as set forth in claim 1, in which floating gate type field effect transistors respectively serve as said plurality of memory cells.

3. The non-volatile semiconductor memory device as set forth in claim 2, each floating gate type field effect transistor having a source node, a gate node and a drain node and wherein said addressing system includes:

a plurality of word lines selectively connected to said gate nodes of said floating gate type field effect transistors, a plurality of bit lines selectively connected to said drain nodes of said floating gate type filed effect transistors, a row address decoder connected to said plurality of word lines, said row address decoder being responsive to row address signals so as to make selected floating gate type field effect transistors accessible through said plurality of bit lines, a first-stage column address decoder and selector unit connected to said plurality of bit lines, said first-stage column address decoder being responsive to first column address signals so as to connect said at least one first accessible memory cell to said verify unit, and a second-stage column address decoder and selector unit connected between said first-stage column address decoder and selector unit and said sense amplifier unit, said second-stage column address decoder and selector unit being responsive to second column address signals so as to connect said at least one second accessible memory cell selected from said at least one first accessible memory cell to said sense amplifier unit.

4. The non-volatile semiconductor memory device as set forth in claim 1, in which said verify unit includes:

a plurality of potential detectors electrically connected to said at least one first accessible memory cell, respectively, for generating respective detecting signals, each detecting signal representative of an entry of one of said at least one first accessible memory cells into said erased state, and a plurality of discharging transistors coupled in parallel between an input node of said sense amplifier unit and a constant potential line, said plurality of discharging transistors respectively responsive to said detecting signals for generating said control signal at said input node.

5. The non-volatile semiconductor memory device as set forth in claim 4, in which each of said plurality of potential detectors has:

a load element coupled to a current source, a switching transistor coupled between said load element and one of said at least one first accessible memory cells, said switching transistor responsive to a verify control signal for connecting said load element to said one of said at least one first accessible memory cells, and a logic circuit enabled by said verify control signal, said logic circuit responsive to a potential level at a node between said load element and said switching transistor for generating said detecting signal.

6. The non-volatile semiconductor memory device as set forth in claim 1, in which said verify unit includes:

a plurality of potential detectors electronically connected to said at least one first accessible memory cell, respectively, for generating respective detecting signals, each detecting signal representative of entry of one of said at least one first accessible memory cells into said erased state, a logic gate having input nodes respectively connected to said plurality of potential detectors for generating a gate control signal when said plurality of potential detectors respectively generates said detecting signals, and a discharging transistor coupled between an input node of said sense amplifier unit and a constant potential line, said discharging transistor responsive to said gate control signal at said input node.

7. The non-volatile semiconductor memory device as set forth in claim 6, in which each of said potential detectors has:

a load element coupled to a current source, a switching transistor coupled between said load element and one of said at least one first accessible memory cells, said switching transistor responsive to a verify control signal for connecting said load element to said one of said at least one first accessible memory cells, and a logic gate enabled by said verify control signal, said logic gate responsive to a potential level at a node between said load element and said switching transistor for generating said detecting signal.

8. The non-volatile semiconductor memory device as set forth in claim 1, further comprising:

an erasing unit coupled to said plurality of memory cells for changing at least one of said plurality of memory cells to said erased state, a write-in unit selectively connectable to said plurality of memory cells for changing at least one of said plurality of memory cells to said write-in state.

9. A non-volatile semiconductor memory device as set forth in claim 1, in which said verify unit performs an erase and verify operation on said plurality of memory cells.

10. The non-volatile semiconductor memory device as set forth in claim 9, in which said verify unit carries out said erase and verify operation on a second plurality of memory cells concurrently selected by a word line.

11. The non-volatile semiconductor memory device as set forth in claim 10, in which said erase verify circuit is connected to individual bit lines respectively coupled to said second plurality of memory cells concurrently selected by said word line.

12. The non-volatile semiconductor memory device as set forth in claim 11, further comprising:

a plurality of bit lines divided into bit line groups, each of said individual bit lines being selected from one of said bit line groups, a first bit line selecting circuit for selecting said individual bit lines from said bit line groups, and a second bit line selecting circuit for selecting a predetermined number of bit lines from said individual bit lines in a read-out operation, said second bit line selecting circuit being prevent from selecting those individual bit lines upon which said verify unit is performing said erase and verify operation so as to allow said verify unit to carry out said erase and verify operation.

13. A non-volatile semiconductor memory device comprising:

a sense amplifier unit, an erase verify circuit configured for performing an erase and verify operation on a plurality of memory cells concurrently selected by a word line, said erase verify circuit connected to individual bit lines respectively coupled to said plurality of memory cells concurrently selected by said word line, a plurality of bit lines divided into bit line groups, each of said individual bit lines being selected from one of said bit line groups, a first bit line selecting circuit for selecting said individual bit lines from said bit line groups, and a second bit line selecting circuit for selecting a predetermined number of bit lines from said individual bit lines in a read-out operation, said second bit line selecting circuit being prevented from selecting those individual bit lines upon which said erase verify circuit is performing said erase and verify operation so as to allow said erase verify circuit to carry out said erase and verify operation.

* * * * *